(12) United States Patent
Glodde et al.

(10) Patent No.: US 7,655,379 B2
(45) Date of Patent: *Feb. 2, 2010

(54) IONIC, ORGANIC PHOTOACID GENERATORS FOR DUV, MUV AND OPTICAL LITHOGRAPHY BASED ON PERACEPTOR-SUBSTITUTED AROMATIC ANIONS

(75) Inventors: Martin Glodde, Mahawah, NJ (US); Sen Liu, Highland Park, NJ (US); Irene Y. Popova, Beacon, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 11/970,731

(22) Filed: Jan. 8, 2008

(65) Prior Publication Data

US 2009/0176173 A1 Jul. 9, 2009

(51) Int. Cl.
*G03F 7/004* (2006.01)
*G03F 7/30* (2006.01)
*C07C 23/08* (2006.01)
*C07C 23/18* (2006.01)
*C07C 23/34* (2006.01)
*C07C 23/44* (2006.01)

(52) U.S. Cl. .................. 430/270.1; 430/326; 430/313; 558/427; 558/432; 570/183; 570/187

(58) Field of Classification Search .............. 430/270.1, 430/326, 313; 549/70, 78; 558/432, 427; 570/183, 187

See application file for complete search history.

(56) References Cited

U.S. PATENT DOCUMENTS

| | | | |
|---|---|---|---|
| 3,853,943 A | 12/1974 | Webster | 558/432 |
| 6,093,753 A | 7/2000 | Takahashi | 522/25 |
| 6,908,722 B2 | 6/2005 | Ebata et al. | 430/270.1 |
| 7,192,686 B2 | 3/2007 | Meagley | 430/270.1 |
| 7,217,492 B2 | 5/2007 | Yoneda et al. | 430/270.1 |

OTHER PUBLICATIONS

U.S. Appl. No. 11/970,827, filed Jan. 8, 2008, Martin Glodde.
Wallraff, et al., Lithographic Imaging Techniques . . . *Chem. Rev.*, 1999, 99, 1801-1821.

(Continued)

*Primary Examiner*—John S Chu
(74) *Attorney, Agent, or Firm*—The Law Offices of Robert J. Eichelburg (57) ABSTRACT

A photoacid generator compound $P^+A^-$, comprises an antenna group $P^+$ comprising a cation that generates protons upon interaction with light, and $A^-$ comprising a weakly coordinating peracceptor-substituted aromatic anion that does not contain fluorine or semi-metallic elements such as boron. In one embodiment, such anions comprise the following compounds 4, 5, 6 and 7,

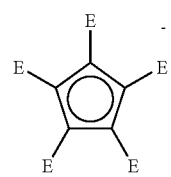

4

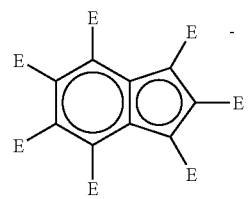

5

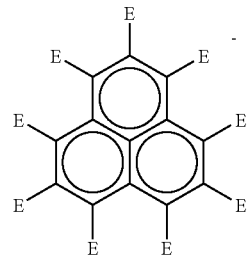

6

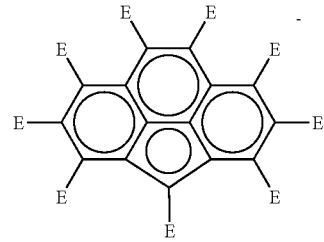

7 wherein E comprises an electron-withdrawing group and the removal of one proton generates aromaticity. $P^+$ comprises an onium cation that decomposes into a proton and other components upon interaction with photons. $P^+$ may comprise an organic chalcogen onium cation or a halonium cation, wherein the chalcogen onium cation in another embodiment may comprises an oxonium, sulfonium, selenium, tellurium, or onium cation, and the halonium cation may comprise an iodonium, chlorine or bromine onium cation. A novel compound comprises TPS CN5. A photolithographic formulation comprises the photoacid generator in combination with a photolithographic composition such as a photolithographic polymer. The formulation, when on a substrate, is exposed to optical lithographic radiation or ArF (193 nm) or KrF (248 nm) radiation, and developed. A product comprises an article of manufacture made by the method of the invention.

24 Claims, 1 Drawing Sheet

OTHER PUBLICATIONS

Crivello, the Discovery and Development of Onium . . . Jour. Of Pol. Sci.: Part A: Pol. Chem., vol. 37, 4241-4254 (1999).

Vianello, et al. ,Towards highly powerful neutral organic .superacids . . . Tetrahedron 61 (2005) 9381-9390.

Vianello, et al. , In Search of Ultrastrong Bronsted Neutral . . . Superacids . . . *Chem. Eur. J.* 2004, 10, 5751-5760.

*J. Org. Chem.* 1958, 53, 5571-5573.

Richardson et al., Exploration of the Pentacyano-*cycol*-pewntadiene ion . . . *Chem. Commun.*, 2004, 706-707.

Simmons et al., Thiacyanocarbons . . . *J. Org. Chem.*,1980, 45, 5113-5121.

IONIC, ORGANIC PHOTOACID GENERATORS FOR DUV, MUV AND OPTICAL LITHOGRAPHY BASED ON PERACEPTOR-SUBSTITUTED AROMATIC ANIONS

FIELD OF THE INVENTION

The field of the invention comprises ionic, organic photoacid generators (PAGs) for optical lithography based on peraceptor-substituted aromatic anions.

BACKGROUND OF THE INVENTION AND RELATED ART

In the field of semiconductor manufacturing, optical lithography has been the mainstream approach used in patterning semiconductor devices. In typical prior art photolithography processes, UV light is projected onto a silicon wafer coated with a thin layer of photosensitive resist (photoresist) through a mask that defines a particular circuitry pattern. Exposure to UV light, followed by subsequent baking, induces a photochemical reaction which changes the solubility of the exposed regions of the photoresist. Thereafter, an appropriate developer, usually an aqueous base solution, is used to selectively remove the portion of the photoresist affected by the photochemical reaction, either in the exposed regions (positive-tone photoresists), or in the unexposed regions (negative-tone photoresists). The pattern thus defined is then imprinted on the silicon wafer by etching away the regions that are not protected by the photoresist with a dry or wet etch process.

One type of photoresist employed in the prior art is a chemically amplified photoresist (CAR) which uses acid catalysis (H. Ito, *Adv. Polym. Sci.* 2005, 172, 37; G. Wallraff, W. Hinsberg, *Chem. Rev.* 1999, 99, 1801). A typical prior art chemically amplified photoresist, for example, is formulated by dissolving an acid sensitive polymer and a photoacid generator (PAG) in a casting solution (J. Crivello, *J. Polym. Sci. Part A: Polym. Chem.* 1999, 37, 4241; H. Ito, C. G. Wilson, Polym. Eng. Sci. 23, 1012 (1983)). A chemically amplified photoresist is especially useful when relatively short wavelength radiation is employed, including deep UV radiation (DUV) 150-350 nm wavelengths, and mid-UV radiation (MUV), e.g., 350-450 nm wavelengths. The shorter wavelengths are typically desired to increase resolution, and thus, decrease feature size of the semiconductor devices, but fewer photons are radiated for a given energy dose.

Accordingly, higher exposure doses are typically required when using UV radiation to obtain a sufficient photochemical response in the photoresist unless a chemically amplified photoresist is employed. In a chemically amplified photoresist, acid sensitivity of the base polymer exists because acid sensitive side chain groups are bonded to the polymer backbone. PAGs comprise non-acidic molecules that form acid when decomposed through interaction with light. Acid is therefore only formed in irradiated regions of the resists. When a positive-tone photoresist is heated after such exposures, the generated acid causes catalytic cleavage of the acid sensitive side chain groups. A single acid catalyst molecule generated in this manner may be capable of cleaving multiple side chain groups, thus allowing lower exposure doses for the needed photochemical response.

Ionic PAGs have the general structure $P^+A^-$, where $P^+$ decomposes into protons ($H^+$) upon irradiation with light, while $A^-$ remains unchanged and forms the acid $H^+A^-$. In an efficient PAG, $P^+$ therefore highly absorbs the photons of interest, while $A^-$ should be more or less inert to photon interaction. Because of the relatively low intensity of ArF laser source (193 nm) and relatively high binding energy of acid labile moieties in ArF photoresist, PAGs which can produce a strong Bronsted acid with high sensitivity comprise acids preferred to realize such chemical amplification in commercial lithography. The traditional way to increase acid strength of PAGs is to use sulfonic acids ($R-SO_3H$) rather than carboxylic acids ($R-COOH$) and to attach strong electron-withdrawing substituents to the R group adjacent to the acid moiety. The simplest way of achieving this goal is to use perfluorosubstituted alkyl groups as R, in which fluorine acts as a strong electron acceptor. Therefore, onium salts having fluorine-containing anions $A^-$ such as perfluoroalkylsulfonate (PFAS), more specifically perfluorooctylsulfonate (PFOS) or perfluorobutanesulfonate (PFBuS), comprise photoacid generators in ArF photoresist system, in part because they result in generation of strong acid.

Examples of such commercially available PAGs comprise, for example, triphenylsulfonium nonafluorobutanesulfonate (1, "TPS PFBuS") or bis (4-t-butyl-phenyl) iodonium nonafluorobutanesulfonate (2, "DTBPIO PFBuS").

In recent years, there has been a desire in the microelectronics industry to eliminate the use of perfluorinated carbons (PFCs) such as PFOS and PFAS. Thus, there is a desire to find alternative photoacid generators which can be used without adversely impacting the performance of lithographic processes. In part, this desire is caused by increasing concerns about their environmental impact, such as their limited biodegradability, which makes it difficult to clear waste water from manufacturing sites using PAGs that generate perfluoroalkylsulfonic acids. The internet (http://www.itrs.net) also addresses environmental issues regarding the use of PAGs based on perfluorinated carbons. In addition, there has been a desire to minimize or eliminate fluorine content in photoresists in order to improve etch resistance and other aspects of lithographic imaging processes.

Some attempts have been made to develop photoresist formulations that do not use perfluorinated carbon-containing photoacid generators, however these have largely been unsuccessful in achieving performance comparable to formulations using PFOS. For example, TPS camphorsulfonate (3) has no fluorine in its anion A⁻. However, the corresponding acid, camphorsulfonic acid, is not as strong as perfluoroalkyl-sulfonic acids and therefore not suitable for ArF resist deprotection, i.e., cleavage of the polymer-bound acid-labile moieties, leading to changes in the resist solubility in the irradiated areas.

In general, the strength of an acid is controlled by the capability of its corresponding anion to bind a proton: the more weakly coordinating the anion, the stronger the acid. R. P. Meagley, U.S. Pat. No. 7,192,686 discloses fluorine-free PAGs based on carborane anions associated with acid-generating cations. However, the impact of therein proposed boron-containing materials, such as carborane compounds, on post-lithography steps in chip manufacturing (e.g., etching) is not known at the present time.

RELATED ART

The following references comprise related art teachings:
H. Ito, *Adv. Polym. Sci.* 2005, 172, 37;
G. Wallraff, W. Hinsberg, *Chem. Rev.* 1999, 99, 1801;
J. Crivello, *J. Polym. Sci. Part A: Polym. Chem.* 1999, 37, 4241; http://www.itrs.net;
R. P. Meagley, U.S. Pat. No. 7,192,686 (2007);
R. Vianello, Z. Maksic, *Tetrahedron* 2005, 61, 9381;
O. Webster, *J. Am. Chem. Soc.* 1966, 88, 4055;
H. E. Simmons, et al., *J. Org. Chem.* 1980, 45, 5113;
C. Richardson, C. Reed, *Chem. Commun.* 2004, 706;
O. Webster, U.S. Pat. No. 3,853,943;
R. D. Miller, A. F. Renaldo, H. Ito, *J. Org. Chem.* 1988, 53, 5571
S. Ebata, et al., U.S. Pat. No. 6,908,722 (2005);
E. Yoneda, et al., U.S. Pat. No. 7,217,492 (2007).
Glodde, U.S. patent application Ser. No. 11/970,827 Filed Jan. 8, 2008.

Ebata, et al. (supra) and Yoneda, et al. (supra) describe P⁺ cations containing groups comprising:

where Ar represents an aryl group that can be substituted with common substituents.

SUMMARY OF THE INVENTION

The foregoing therefore shows an industry need for compounds, compositions and processes that employ weakly coordinating purely organic anions to replace perfluoroalkyl-sulfonate anions in PAGs for lithographic imaging, especially lithographic imaging using DUV (wavelengths about 150 to about 350 nm), MUV (wavelengths about 350 to about 450 nm) or optical radiation (wavelengths greater than about 450 nm).

Accordingly, the present invention provides such compounds, compositions and processes that address these needs to not only provide advantages over the related art, but also to substantially obviate one or more of the foregoing and other limitations and disadvantages of the related art, such as excessively high fluorine content of the by-product of the some PAGs used in photolithography. Not only do the written description, claims, abstract of the disclosure, and the drawings, that follow set forth various features, objectives and advantages of the invention and how they may be realized and obtained, but they will also become apparent by practicing the invention.

To achieve these and other advantages, and in accordance with the purpose of the invention as embodied and broadly described herein, the invention comprises novel PAGs and an improved method for lithographic imaging using these PAGs, such as optical lithography or lithography using DUV or MUV irradiation.

In one aspect, the present invention comprises a photoresist compound, composition and process comprising onium salts of a cation that generate protons upon interaction with light and a weakly coordinating peracceptor-substituted aromatic anion. In some embodiments of the invention, protonation of such anions form fluorine free superacids, theoretically exhibit calculated pKa values ranging from about −13 to about −22 (R. Vianello, Z. Maksic, *Tetrahedron* 2005, 61, 9381). The resulting onium PAGs when incorporated into photoresist formulations and exposed to ArF (193 nm) or KrF (248 nm) DUV irradiation show excellent optical clarity, thermal stability and lithographic performance.

These PAGs generate superacids i.e., acids stronger than sulfuric acid, that do not contain fluorine, or boron or other semi-metallic elements. The semi-metallic elements in this regard comprise, in addition to boron, silicon, germanium, arsenic, selenium, antimony and tellurium. Moreover, this new class of PAGs demonstrates the feasibility of creating unconventional purely organic PAGs by combining acid-generating cations with weakly coordinating anions that are not based on sulfonic acids.

BRIEF DESCRIPTION OF THE DRAWINGS

The accompanying Figures, incorporated into this specification, together with the detailed description herein serve to further illustrate various embodiments and to explain various principles and advantages of the present invention.

FIG. 1(a) shows 75 nm lines at 245 nm pitch (pitch size defined as the distance between two adjacent lines i.e., the size sum of the line and its adjacent space); FIG. 1(b) shows 75 nm lines at 560 nm pitch.

DETAILED DESCRIPTION OF THE INVENTION

To achieve these and other advantages, and in accordance with the purpose of this invention as embodied and broadly described herein, the following detailed embodiments comprise disclosed examples that can be embodied in various forms. The specific compounds, compositions, processes and structural details set out herein comprise a basis for the claims and a basis for teaching one skilled in the art to employ the present invention in any novel and useful way. The terms, phrases and Figures also set out herein provide a description of how to make and use this invention.

The present invention comprises novel photoacid generators to be formulated into polymer compositions useful in lithographic processes, using optical lithography or DUV photons. In carrying out the present invention, conventional materials, processing techniques and exposure techniques can be employed and, hence, such conventional aspects are not set forth herein in detail, for example, the selection of suitable resist polymers, acids, base quenchers, solvents and optional additional components, such as, photosensitizers, dissolution modifying agents or surfactants is conducted in a conventional manner.

One having ordinary skill in the relevant art once aware of the present disclosure could employ suitable formulation, coating and exposure techniques without undue experimentation.

In one aspect, the invention comprises a method for forming a photolithographic image comprising forming a photoresist formulation comprising:

a) an acid-sensitive imaging polymer that is originally insoluble in aqueous, alkaline developers, but becomes soluble upon reaction with protons, with or without the aid of heating;

b) a photoacid generator $P^+A^-$ that decomposes into the acid $H^+A^-$ upon irradiation with photons;

c) a small amount of a base quencher;

applying the formulation to a substrate to obtain a treated substrate and pattern wise exposing the treated substrate to optical radiation; selectively removing portions of the photoresist layer to expose portions of the material surface; and etching or ion implanting the exposed portions of the material, thereby forming a patterned material feature or features;

wherein $A^-$ comprises cyclic, peracceptor-substituted organic anions that do not contain fluorine, or semi-metallic elements. In one embodiment, such anion $A^-$ comprises at least one of 4, 6, 6 or 7:

4

5

6

7 wherein E comprises an electron-withdrawing group and the removal of one proton generates aromaticity. In one embodiment, the substituent E may comprise at least one of a cyano (CN), alkyl, alkyloxy, hydrogen, nitro, alkylcarbonyloxy, alkyloxycarbonyl, chlorine, bromine, iodine, aryl, aryloxy, arylcarbonyloxy, or aryloxycarbonyl group. In another embodiment, $A^-$ of the photoacid generator $P^+A^-$ may comprise:

wherein E comprises CN, $CO_2CH_3$, $CO_2C_2H_5$, $CO_2(CH_2)_2OH$, $NO_2$, or H, such as the anion 8 wherein $A^-$ of the photoacid generator $P^+A^-$ comprises:

8

In a further embodiment $P^+$ of the photoacid generator $P^+A^-$ may comprise a chalconium cation $R^1R^2R^3Ch^+$, wherein $Ch^+$ comprises a chalcogen, except for Te. In one embodiment, the chalcogen comprises sulfur. The photoacid generators of the invention are not limited to any specific chalconium cations. In one embodiment sulfonium cation structures contain aromatic moieties in one or more pendant groups $R^1$, $R^2$ or $R^3$. In another embodiment sulfonium cation structures comprise:

5 where each $R^4$ independently comprises at least one of H; linear, branched, tertiary, or cyclic alkyl; linear, branched, tertiary or cyclic alkoxy; unsubstituted and substituted phenyl; unsubstituted and substituted naphthyl; or unsubstituted and substituted fluorenyl e.g.:

In another embodiment, sulfonium cation $R^1$ and $R^2$ comprises at least one of H; linear, branched, tertiary, or cyclic alkyl; linear, branched, tertiary or cyclic alkoxy; unsubstituted and substituted phenyl; unsubstituted and substituted naphthyl; or unsubstituted and substituted fluorenyl; or $R^1$ and $R^2$ comprise collectively a $C_2$-$C_{30}$ linear or branched alkylene $(CH_2)_n$ chain. $R^3$ comprises at least one of Ar and Ar—CO—CH$_2$—, where Ar comprises, an aryl group, optionally substituted with common substituents, such as OH, branched, linear or cyclic alkyl or branched, linear or cyclic alkyloxy. In one embodiment, the cation comprises a fluorine-free cation. One example of these compounds comprises:

9

In a further embodiment, P$^+$ comprises a halonium ion $R^1R^2X^+$, wherein X comprises chlorine, bromine or iodine. In one example of these compounds, X comprises iodine. The photoacid generators of the invention are not limited to any specific halonium cations, but the halonium ions, such as those comprising iodonium cation structures and other structures contain aromatic moieties in one or more pendant groups $R^1$ or $R^2$, that are optionally further substituted with common substituents, comprising H; linear, branched, tertiary, or cyclic alkyl; linear, branched, tertiary or cyclic alkoxy; unsubstituted and substituted phenyl; unsubstituted and substituted naphthyl; or unsubstituted and substituted fluorenyl, e.g.

The photoresist composition in this regard comprises a polymer which comprises an ethylenic backbone, e.g., the polymer contains vinyl, acrylate and/or methacrylate monomeric units. The backbone of the polymer comprises a backbone free of unsaturated carbon bonds. In general, the photoresist compositions of the invention are not limited to any specific imaging polymer. In one embodiment, the imaging polymer is one suitable for use in 193 nm (ArF) lithography. In another embodiment the imaging polymer is suitable for use in 248 nm (KrF) lithography, or DUV or MUV lithography.

The imaging polymer may be either positive-tone or negative-tone and in one embodiment comprises a polymer capable of undergoing chemical transformations upon exposure of the photoresist composition to UV light whereby a differential in the solubility of the polymer in either the exposed regions or the unexposed regions is created. That is, the base polymers employed in the present invention include any acid sensitive polymer having acid sensitive side groups which can undergo catalytic cleavage in the presence of an acid generated by the inventive photoacid generator. In one embodiment, the polymers comprise those where at least one of the sensitive side groups comprise polycyclic side groups.

As noted before, the acid sensitive side groups of the polymers may contain a lactone moiety or may be protected with various acid labile protecting groups that are conventional and well known in the art. Such protecting groups comprise groups requiring high activation energy (e.g. tert-butyl ester or tert-butyl carbonyl groups), low activation energy (e.g. acetal, ketal, or silylethers), or a combination of both. In another embodiment, the imaging polymers comprise poly ([N-(trifluoromethysulfonyl)methacrylamide]-co-[2-methyl-2-adamantyl methacrylate]-co-[5-methacryloyloxy-2,6-norbornane carbolactone]) ("S1"), poly([2-methyl-2-adamantyl methacrylate]-co-[5-methacryloyloxy-2,6-norbornane carbolactone] ("MADMA-NORLAC") and, for embodiments where 248 nm (KrF) radiation is used, poly(4-hydroxystyrene co-tert-butyl acrylate) (65/35) ("ESCAP"):

The imaging polymer in one embodiment is capable of undergoing chemical transformations upon exposure of the photoresist composition to optical, DUV, or MUV radiation whereby a differential in the solubility of the polymer in either the exposed regions or the unexposed regions is created. The base polymers employed in the present invention include any acid sensitive polymer having acid sensitive side chains which can undergo catalytic cleavage in the presence of an acid generated by the inventive photoacid generator. The imaging polymer may be either a positive-tone imaging polymer or a negative-tone imaging polymer. In such polymers, the acid sensitivity exists because of the presence of acid sensitive side chains that are bonded to the polymer backbone. Such acid sensitive polymers including acid sensitive side chains are conventional and are well known in the art. In one embodiment, the imaging polymer is suitable for use in 193 nm (ArF) lithography.

In other embodiments, the acid sensitive side chains of the acid sensitive polymers are protected with various acid labile protecting groups that are well known to those skilled in the art. For example, the acid sensitive side chains may be protected with high activation energy protecting groups such as t-butyl ester or t-butyl carbonyl groups, a low activation energy protecting group such as acetal, ketal, or silyethers, or a combination of both low and high activation energy protecting groups may also be used. In one embodiment, the, the imaging polymer of the invention comprises a lactone moiety, e.g., a pendant lactone moiety. Examples of imaging polymers containing lactone moieties are well known in the art. See for example US Published Patent Application No. 20060216643A1, and U.S. Pat. Nos. 7,087,356, 7,063,931, 6,902,874, 6,730,452, 6,627,391, 6,635,401 and 6,756,180.

The photoresist compositions of the invention in one embodiment contain a solvent which is capable of dissolving the acid sensitive polymer. Illustrative examples of such solvents include, but are not limited to: ethers, glycol ethers, aromatic hydrocarbons, ketones, esters and the like. A solvent system including a mixture of the aforementioned solvents is also contemplated herein. Suitable glycol ethers include: 2-methoxyethylether (diglyme) ethylene-glycolmonomethylether, propyleneglycolmonomethylether, propyleneglycolmonomethylether acetate (PGMEA) and the like. Examples of suitable aromatic hydrocarbon solvents include: toluene, xylene, and benzene. Examples of ketones include: methylisobutylketone, 2-heptanone, cycloheptanone, and cyclohexanone. An example of an ether solvent is tetrahydrofuran, whereas ethyl lactate and ethoxyethyl propionate are examples of ester solvents that may be employed herein. PGMEA comprises one of these solvents.

In addition to the above components, the photoresist composition may also include other components such as photosensitizers, bases, surfactants or other additives. Combinations or mixtures of these other components may be used (e.g., a photosensitizer and a base).

An optional photosensitizer comprises a sensitizer containing chromophores that are capable of absorbing irradiation in 193 nm (ArF) lithography. Illustrative examples of such compounds include, but are not limited to: 9-anthracene methanol, coumarins, 9,10-bis(trimethoxysily ethynyl)anthracene and polymers containing these chromophores. Of these compounds, one embodiment comprises 9-anthracenemethanol as the photosensitizer.

The optional base quenchers that can be employed in the present invention include, but are not limited to: berberine, cetyltrimethylammonium hydroxide, 1,8-bis(dimethylamino)naphthalene, tetrabutylammonium hydroxide (TBAH), amines, polymeric amines, N-butoxycarbonyl-protected amines and the like. When a base quencher is employed with the inventive chemically amplified photoresist composition, in one embodiment, TBAH comprises the base quencher.

The optional surfactants that can be employed in the photoresist compositions include any surfactant that is capable of improving the coating homogeneity of the chemically amplified photoresist composition of the present invention. Illustrative examples include: fluorine-containing surfactants such as 3M's FC-430® and siloxane-containing surfactants such as Union Carbide's Silwet® series.

The invention also encompasses processes for using the compositions of the invention to form patterned material features on a substrate comprising a material surface which may comprise a metal conductor layer, a ceramic insulator layer, a semiconductor layer or other material depending on the stage of the manufacture process and the desired material set for the end product. The compounds and compositions of the invention are especially useful for lithographic processes used in the manufacture of integrated circuits on semiconductor substrates. The compounds and compositions of the invention used in lithographic processes create patterned material layer structures such as metal wiring lines, holes for contacts or vias, insulation sections (e.g., damascene trenches or shallow trench isolation), trenches for capacitor structures, ion implanted semiconductor structures for transistors, and the like as might be used in integrated circuit devices.

In some cases, a bottom antireflective coating (BARC) and/or underlayer coating (e.g., a planarizing underlayer) may be applied between the photoresist layer and the material surface. In some cases, a top antireflective coating layer may be applied over the photoresist layer (i.e., on the side of the photoresist layer distal from the material surface). The invention is not limited to the use of antireflective reflective coatings and/or underlayer materials, or specific compositions of those coatings or materials.

After exposure, the photoresist structure with the desired pattern is obtained (developed) by contacting the photoresist layer with an aqueous alkaline solution which selectively dissolves the areas of the photoresist which were exposed to radiation in the case of a positive photoresist (or the unexposed areas in the case of a negative photoresist). Some aqueous alkaline solutions (developers) comprise aqueous solutions of tetramethyl ammonium hydroxide. The resulting lithographic structure on the substrate is then typically dried to remove any remaining developer. If a top antireflective coating has been used, it can be dissolved by the developer in this step.

The pattern from the photoresist structure may then be transferred to the exposed portions of underlying material of the substrate by etching with a suitable etchant using techniques known in the art; e.g., the transfer comprises reactive ion etching or by wet etching. Once the desired pattern transfer has taken place, any remaining photoresist may be removed using conventional stripping techniques. Alternatively, the pattern may be transferred by ion implantation to form a pattern of ion implanted material.

Examples of general lithographic processes where the compound or composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570. Other examples of pattern transfer processes are described in Chapters 12 and 13 of "Semiconductor Lithography, Principles, Practices, and Materials" by Wayne Moreau, Plenum Press, (1988). It should be understood that the invention is not limited to any specific lithography technique or device structure.

In one aspect, the invention comprises the following ionic photoacid generators (PAGs) of the general structure $P^+A^-$, where:

I. $P^+$ represents an onium cation that decomposes into a proton and other components upon interaction with photons, i.e., $P^+$ comprises an onium cation such as a chalconium cation, e.g., an organic oxonium, sulfonium, or selenium type onium cation, or a halonium cation, particularly iodonium cation, of the general structure $R^1R^2R^3Ch^+$, or $R^1R^2X^+$, respectively, where $R^1$, $R^2$, $R^3$ represent aliphatic or aromatic moieties that can be unsubstituted or substituted with common substituents, such as alkyl, aryl, alkoxy, aryloxy, nitro, alkyloxy or aryloxy, chlorine, bromine, or iodine, or alkylcarbonyloxy, alkoxycarbonyl, arylcarbonyloxy, aryloxycarbonyl groups, and where $Ch^+$ represents oxygen, sulfur or selenium, as in the compounds $R^1R^2R^3O^+$, or $R^1R^2R^3S^+$, or $R^1R^2R^3Se^+$, and $X^+$ represents a halogen, such as chlorine, bromine, or iodine, but particularly iodine. In certain sulfonium ions, $R^1$ and $R^2$ comprises at least one of H; linear, branched, tertiary, or cyclic alkyl; linear, branched, tertiary or cyclic alkoxy; unsubstituted and substituted phenyl; unsubstituted and substituted naphthyl; or unsubstituted and substituted fluorenyl; or $R^1$ and $R^2$ comprise a $C_2$-$C_{30}$ linear or branched alkylene $(CH_2)_n$ chain. $R^3$ comprises at least one of Ar and Ar—CO—$CH_2$—, where Ar comprises an aryl group, optionally substituted with common substituents, such as OH, branched, linear or cyclic alkyl or branched, linear or cyclic alkyloxy.

II. $A^-$ represents a weakly coordinating anion of a very strong organic acid. Generally, such anions comprise cyclic organic compounds such as peracceptor-substituted anions with electron-withdrawing groups E, in which a protonation of such cyclic structures would destroy aromaticity. Examples of this class comprise anions 4, 5, 6 and 7, where E represents a strong electron-withdrawing substituent, particularly the cyano group CN. At least one substituent E can also be represented by another group, including but not limited to hydrogen, alkyl, alkyloxy, alkyloxycarbonyl, nitro or chlorine, bromine or iodine and in one embodiment, compound 4 comprises:

The protonation of anions 4, 5, 6 and 7 on their rings would generate their corresponding, non aromatic acids 4a, 5a, 6a and 7a, respectively:

Calculations of the acids 4a, 5a, 6a and 7a with E=CN (R. Vianello, Z. Maksic, *Tetrahedron* 2005, 61, 9381) have shown that all of these are in the gas phase—super acids with $pK_a$ values ranging from about −13 to about −22. O. Webster, *J. Am. Chem. Soc.* 1966, 88, 4055; H. E. Simmons, et al., *J. Org. Chem.* 1980, 45, 5113; C. Richardson, C. Reed, *Chem. Commun.* 2004, 706; O. Webster, U.S. Pat. No. 3,853,943 report the synthesis and characterization of the anion of acid 4 with E=CN, i.e., compound 8. It was not possible, however, to protonate anion 8 with 70% perchloric acid; O. Webster, *J. Am. Chem. Soc.* 1966, 88, 4055. More recently, experiments (C. Richardson, C. Reed, *Chem. Commun.* 2004) and further theoretical calculations (R. Vianello, J. F. Liebman, Z. B. Maksic, *Chem. Eur. J.* 2004, 10, 5751) indicated that protonation of anions 4, 5, 6 and 7 may occur in a different fashion.

II. Specifically, PAGs P$^+$A$^-$ of this invention comprise compounds where:

1. P$^+$ comprises a) a sulfonium cation comprising:

b) an iodonium cation comprising:

2. A$^-$ comprises the anion of a very strong acid comprising:

also referred to as "CN5."

The invention also comprises combinations of the PAGs described herein, such as the two component, three component or four component combinations where the individual PAGs in these combinations may be present in any molar amounts, such as for example anywhere from equimolar amounts to amounts ranging from about 1.0 mol to about 0.001 mol or about 1.0 mol to about 0.050 mol. of one PAG to another.

Similarly, the invention also comprises combinations of the resist polymers described herein, such as the two component, three component or four component combinations where the individual polymers in these combinations may be present in any molar amounts, such as for example anywhere from equimolar amounts to amounts ranging from about 1.0 mol to about 0.001 mol or about 1.0 mol to about 0.050 mol of one polymer to another and employed in the resist formulation (on a dry basis) of anywhere from about 0.001 g of PAG or a mixture of PAGs to about 1 g of resist polymer or combinations of polymers.

EXAMPLES

The following examples illustrate embodiments of the invention.

Example 1

Material Synthesis (Triphenylsulfonium pentacyanocyclopentadienide, 10, [TPS CN5]): To 0.45 g NaH (60% in min. oil) in 35 ml dimethoxyethane was added 0.91 g methyl cyanoacetate under N$_2$. Once hydrogen evolution had ceased, 2.83 g of 2,3,5,6-tetracyano-1,4-dithiin, prepared according to the literature (C. Richardson, C. Reed, Chem. Commun. 706 (2004); H. E. Simmons, et al., J. Org. Chem. 45, 5113 (1980)), was added. The mixture was stirred at 110° C. for 30 min, then heated up to 160° C. until the solvent was evaporated. Remaining traces of solvents were removed in oil pump vacuum, until a dark brown, dry solid was formed. This solid was dissolved in 100 mL of water, followed by addition of 5 mL conc. H$_2$SO$_4$. Filtration from the dark brown solids yielded a reddish solution that was discolored by addition of 10 mL of aqueous 6% sodium hypochlorite solution. Addition of an aqueous solution of triphenylsulfonium chloride (H. Ito, *J. Org. Chem.* 1988, 53, 5571) gave a yellowish precipitate that was filtered, dried and recrystallized from acetone/ether.

Thermal stability test of the neat material with TGA: <1% weight loss at 200° C., ~5% weight loss at 400° C.

Example 2

Material synthesis (Bis(4-tert-butyl-phenyl)iodonium pentacyanocyclopentadienide, 11 [DTBPIO CN5]): To 0.45 g NaH (60% in min. oil) in 35 ml dimethoxyethane was added 0.91 g methyl cyanoacetate under N$_2$. Once hydrogen evolution had ceased, 2.83 g of 2,3,5,6-tetracyano-1,4-dithiin, prepared according to the literature (C. Richardson, C. Reed, Chem. Commun. 706 (2004): H. E. Simmons, et al., J. Org. Chem. 4, 5113 (1980)), was added. The mixture was stirred at 110° C. for 30 min, then heated up to 160° C. until the solvent was evaporated. Remaining traces of solvents were removed in oil pump vacuum, until a dark brown, dry solid was formed. This solid was dissolved in 100 mL of water, followed by addition of 5 mL conc. $H_2SO_4$. Filtration from the dark brown solids yielded a reddish solution that was discolored by addition of 2 mL of 30% $H_2O_2$ and heating to 80° C. for 60 min. The solution was then cooled to room temperature and filtered; excessive $H_2O_2$ was destroyed with $Na_2SO_3$, while a strong acidic pH was maintained. Addition of an aqueous solution of bis(4-tert-butylphenyl)iodonium acetate gave a yellowish precipitate that was filtered, dried and recrystallized from acetone/ether.

Example 3

Formulation and film formation: A resist solution containing 1.5 g S1 polymer, 0.0606 g of TPS CN5 (10) and 0.004551 g N-tert-butoxycarbonyl-pyrrolidine (base quencher; used in very small quantities to quench acid that migrates into unexposed regions, thereby improving image quality) in 20.82 g of propyleneglycolmonomethylether acetate (PGMEA)/cyclohexanone (7/3) was prepared. A silicon wafer was coated with 90 nm AR40 (Rohm & Haas Electronic materials) (bottom anti-reflective coating or BARC, coating at 1500 rpm, then baking at 215° C. for 1 min.), followed by coating with the resist solution (1600 rpm, then baking at 110° C. for 1 min). The obtained film resist film thickness was 200 nm.

Example 4

Formulation and film formation: A propyleneglycolmonomethylether acetate (PGMEA) solution of 10 wt % poly(4-hydroxystyrene-co-tert-butyl acrylate) (65135; ESCAP), bis (2,4,6-trifluorophenyl)iodonium pentacyanocyclopentadienide (DTFPIO CN5), 10, in an amount equimolar to 0.4 wt % TPS PFBuS and tetrabutylammonium hydroxide (TBAH; base quencher) was prepared. TBAH was used in a PAG:TBAH=1:0.05 molar ratio. A silicon wafer (5") was coated with 0.8 nm AR3-600 (3000 rpm, then baking at 220° C. for 1 min.), followed by coating with the resist solution (1400 rpm, then baking at 130° C. for 1 min). The obtained film thickness was 220 nm.

Example 5

Optical Properties (at 193 nm): A thin solid film was prepared by spin-coating photoresist solutions (formulated as described in Example 3) over a clean 5 inch silicon wafers at the spin rate of 1500 rpm for 30 seconds. The resulting films were soft baked in vacuum at 110° C. for 60 seconds. The thickness, n and k were measured by VASE ellipsometry, OD values were calculated from k. The film had a refractive index n=1.7026, k=0.031162 and an optical density of OD= 0.88 $\mu m^{-1}$.

Example 6

Figure 1:
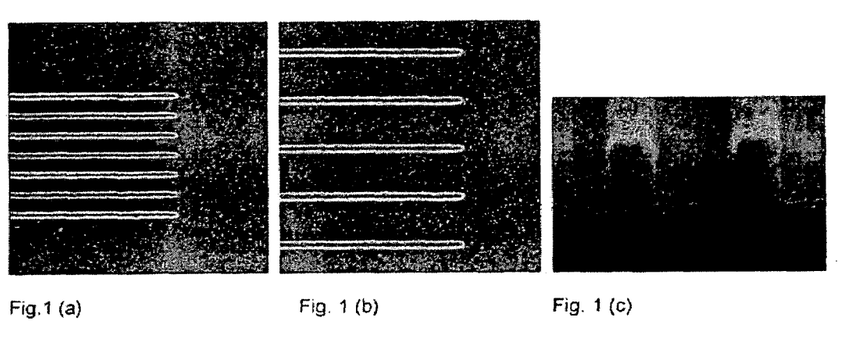
FIG. 1(a) and FIG. 1(b) comprise lithographic patterns obtained from ArF (193 nm radiation) exposures of resist films containing poly ([N-(trifluoromethysulfonyl) meth-acryl-amide]-co-[2-methyl-2-adamantyl methacrylate]-co-[5-methacryloyloxy-2,6-norbornane carbolactone]) ("S1"), compound 10 as a PAG and N-tert-butoxycarbonyl-pyrroli-dine as a base quencher.
FIG. 1(c) shows a cross-sectional SEM image of the line-space array shown in section (a), having resist lines imaged on top of the BARC film. (AR40 [Rohm & Haas Electronic materials] bottom anti-reflective coating or BARC).

Lithographic Performance (ArF exposures): A silicon wafer coated with a bottom antireflective coating (BARC) and a photoresist formulation as described in Example 3 was exposed to conventional 193 nm radiation (ASML 1400 scanner, 0.93NA) with numerical aperture of 0.85NA. The exposure pattern was an array of lines and spaces of various dimensions down to 75 nm. The exposed wafer was then post-exposure baked on a vacuum hot plate at 120° C. for 60 s. Subsequently, the wafer was developed for 60 s with 0.26 M aqueous solution of tetramethylammonium hydroxide. Function of the base used in such developer solutions is to dissolve reacted, soluble resist polymer. The resulting patterns of the photoresist imaging layers were examined by scanning electron microscopy (SEM). The photospeed results were obtained for images of 75 nm lines in 245 nm pitch, yielding $E_S$ (called dose to size—dose necessary to obtain target line size) values of 49 mJ. FIG. 1(a) and (b) shows example SEM images of the patterns obtained from such formulations (two different pitches are shown), containing compound 10 as PAG. FIG. 1(c) shows a cross-sectional SEM image of the line-space array shown in section (a), having resist lines imaged on top of the BARC film.

Example 7

Figure 2:
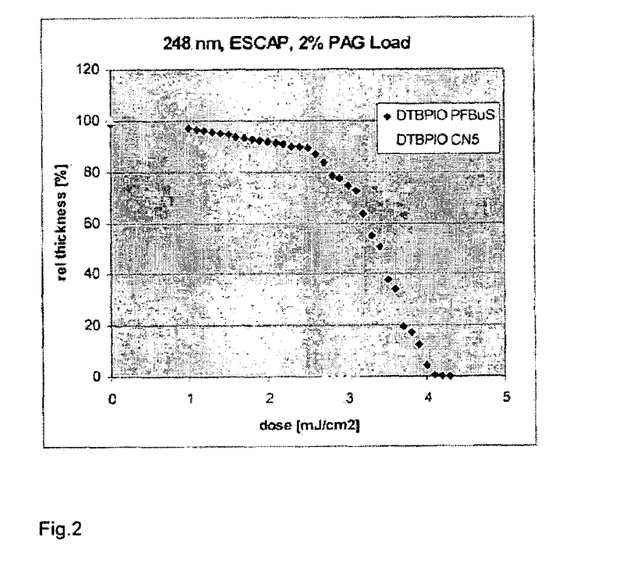
FIG. 2 comprises contrast curves for ESCAP (poly(4-hy-droxystyrene-co-tert-butyl acrylate) 65/35) resist under KrF (248 nm radiation), formulated with commercially available DTBPIO PFBuS (2) and DTBPIO CN5 (11).

Dose-to-Clear Exposures at 248 nm: A silicon wafer was coated with a photoresist formulation as described in Example 4. For comparison, a photoresist formulation was prepared and coated onto another silicon wafer similar to described in Example 4, but containing an equimolar amount of commercially available 2 (DTBPIO PFBuS). FIG. 2 shows the contrast curves for the two formulations when exposed to 248 nm radiation. The photoresist containing compound 11 clears significantly faster than the photoresist containing the commercial reference material.

The compounds of the invention also include various organic and other moieties per se, but are also intended to include organic or other moieties that can be further substituted with substituents; where these organic and other moieties, and/or substituents comprise inter alia, aryl groups, alkyl groups; halogens, such as iodine, chlorine or bromine, alkyloxy, alkyloxo, aryloxo, alkylcarbonyloxy, carboalkoxy, aryl, aryloxy arylcarbonyloxy, or carboaryloxy group carbonyl, nitro, cyano, halogen-substituted alkyl or halogen-substituted alkyloxy (where we define halogen above), substituted alkyl, alkylene, alicyclic, hydrocarbyl, cyclic alkyl (cycloaliphatic), hetero cycloaliphatic, aralkyl or alkaryl, alkoxy, acyl, acyloxy, alkylenoxy, such as defined inter alia by Allen et al., U.S. Pat. No. 7,193,023, col. 3, line 51 to col. 6, line 24, and Mizutani et al. U.S. Pat. No. 7,232,640, col. 8, line 54 to col. 12, line 14, and all other moieties and substituents defined by Allen et al., and/or Mizutani et al.

For the purpose of this invention, the moieties and/or substituents also include combinations of moieties and/or substituents, such as two or more of the moieties and/or substituents These references give ranges of carbon atoms that apply to the various substituents and/or moieties of this invention and the following discussion applies to these ranges as well as the combinations of moieties and/or substituents.

Throughout this specification, abstract of the disclosure, and in the drawings the inventors have set out equivalents, including without limitation, equivalent elements, materials, compounds moieties, substituents, compositions, conditions, processes, structures and the like and even though set out individually, also include combinations of these equivalents such as the two component, three component, or four component combinations, or more as well as combinations of such equivalent elements, materials, compounds, moieties, substituents, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventor also employs the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, and if not specifically stated herein, the written description, specification, claims, drawings, and abstract of the disclosure as subsequently amended.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A photoacid generator $P^+A^-$ that decomposes into the acid $H^+A^-$ upon irradiation with photons
    wherein $A^-$ is the anion of peracceptor-substituted organic superacids that do not contain fluorine, or semi-metallic elements
    comprising at least one of 5, 6 or 7:

5

6

7 wherein E comprises an electron-withdrawing group and is at least one of an alkyl, alkyloxy, hydrogen, nitro, alkylcarbonyloxy, alkoxycarbonyl, chlorine, bromine, iodine, aryl, aryloxy, arylcarbonyloxy, or aryloxycarbonyl group;
and wherein $P^+$ is a fluorine free cation.

2. A chemically amplified photoresist formulation comprising:
    a) an acid-sensitive imaging polymer that is originally insoluble in aqueous, alkaline developers, but becomes soluble upon reaction with protons, with or without the aid of heating;
    b) a photoacid generator $P^+A^-$ that decomposes into the acid $H^+A^-$ upon irradiation with photons
    wherein $A^-$ is the anion of peracceptor-substituted organic superacids that do not contain fluorine, or semi-metallic elements
    comprising at least one of 4, 5, 6 or 7:

4

-continued wherein E comprises an electron-withdrawing group;
c) a small amount of a base quencher, and
$P^+$ is a fluorine free cation.

3. A method of forming a patterned material feature on a substrate, said method comprising:
a) providing a material surface on a substrate;
b) forming a photoresist layer over said material surface, said photoresist comprising
  (i) an acid-sensitive imaging polymer that is originally insoluble in aqueous, alkaline developers, but becomes soluble upon reaction with protons, with or without the aid of heating;
  (ii) A chemically amplified photoresist formulation comprising:
    A) an acid-sensitive imaging polymer that is originally insoluble in aqueous, alkaline developers, but becomes soluble upon reaction with protons, with or without the aid of heating;
    B) a photoacid generator $P^+A^-$ that decomposes into the acid $H^+A^-$ upon irradiation with photons
  wherein $A^-$ is the anion of peracceptor-substituted organic superacids that do not contain fluorine, or semi-metallic elements
  comprising at least one of 4, 5, 6 or 7:

-continued wherein E comprises an electron-withdrawing group:
  (iii) a small amount of a base quencher;
c) patternwise exposing said photoresist layer to optical, DUV or MUV radiation thereby creating a pattern of radiation-exposed regions in said photoresist layer,
d) selectively removing portions of said photoresist layer to expose portions of said material surface, and
e) etching or ion implanting said exposed portions of said material, thereby forming said patterned material feature.

4. The method of claim 3 wherein A− comprises the anion of peracceptor-substituted organic superacids that do not contain fluorine, or semi-metallic elements.

5. The method of claim 3, wherein E comprises at least one of a cyano (CN), alkyl, alkyloxy, hydrogen, nitro, alkylcarbonyloxy, alkoxycarbonyl, chlorine, bromine, iodine, aryl, aryloxy, arylcarbonyloxy, or aryloxycarbonyl group.

6. The method of claim 3 wherein $A^-$ of said photoacid generator $P^+A^-$ comprises:

7. The method of claim 6 wherein E comprises at least one of CN, $CO_2CH_3$, $CO_2C_2H_5$, $CO_2(CH_2)_2OH$, $NO_2$, or H.

8. The method of claim 6 wherein A⁻ of said photoacid generator P⁺A⁻ comprises:

5

9. The method of claim 3, wherein said photoacid generator P⁺A⁻ comprises a fluorine-free photoacid generator.

10. The method of claim 3, wherein P⁺ of said photoacid generator P⁺A⁻ comprises wherein Ch⁺ comprises at least one of S, O, or Se, and R¹, R² and R³ comprise independently selected aromatic moieties.

11. The method of claim 3, wherein P⁺ of said photoacid generator P⁺A⁻ comprises where each R⁴ independently comprises at least one of H; linear, branched, tertiary, or cyclic alkyl; linear, branched, tertiary or cyclic alkoxy; unsubstituted and substituted phenyl; unsubstituted and substituted naphthyl; or unsubstituted and substituted fluorenyl.

12. The method of claim 3 wherein P⁺ of said photoacid generator P⁺A⁻ comprises

13. The method of claim 3, wherein P⁺ of said photoacid generator compound P⁺A⁻ comprises wherein R¹ and R² each independently comprise at least one of H; linear, branched, tertiary, or cyclic alkyl; linear, branched, tertiary or cyclic alkoxy; unsubstituted and substituted phenyl; unsubstituted and substituted naphthyl; or unsubstituted and substituted fluorenyl; R² comprises at least one of a C₂-C₃₀ linear or branch alkylene (CH₂)ₙ chain and R³ comprise Ar and Ar—CO—CH₂—, where Ar comprises an aryl group, optionally substituted with OH, branched, linear or cyclic alkyl or branched, linear or cyclic alkyloxy groups.

14. The method of claim 3, wherein P⁺ of said photoacid generator compound P⁺A⁻ comprises 15. The method of claim 3 wherein P⁺ of said photoacid generator P⁺A⁻, comprises:

wherein X⁺ comprises at least one of chlorine, bromine or iodine; and R¹ or R² comprise aromatic pendant groups optionally substituted with at least one of H; linear, branched, tertiary, or cyclic alkyl; linear, branched, tertiary or cyclic alkoxy; unsubstituted and substituted phenyl; unsubstituted and substituted naphthyl; or unsubstituted and substituted fluorenyl.

16. The method of claim 3 wherein P⁺ of said photoacid generator P⁺A⁻, comprises 17. The method of claim 3 wherein said photoacid generator comprises TPS CN5 (10).

18. The method of claim 3, wherein said imaging polymer comprises at least one of S1, MADMA-NORLAC, or ESCAP.

19. The method of claim 3 wherein said photoacid generator comprises at least one of TPS CN5 (10), DTBPIO CN5 (11) or and said resist polymer comprises at least one of S1, and MADMA-NORLAC.

20. The method of claim 19, wherein said radiation comprises ArF laser radiation.

21. The method of claim 3 wherein said photoacid generator comprises at least one of TPS CN5 (10), DTBPIO CN5 (11) or and said resist polymer comprises at least ESCAP.

22. The method of claim 21, wherein said radiation comprises KrF laser radiation.

23. The method of claim 3 wherein E comprises CN in the compounds comprising 4, 5, 6, or 7.

24. A photoacid generator comprising TPS CN5 (10).

* * * * *